March 17, 1964 J. L. DE CLUE 3,125,693

HIGH DYNAMIC INPUT IMPEDANCE AMPLIFIER

Filed Dec. 1, 1961 2 Sheets-Sheet 1

INVENTOR:
Joseph L. DeClue,
BY
Henry L. Hanson
ATTORNEY

March 17, 1964 J. L. DE CLUE 3,125,693

HIGH DYNAMIC INPUT IMPEDANCE AMPLIFIER

Filed Dec. 1, 1961 2 Sheets-Sheet 2

INVENTOR:
Joseph L. DeClue,
BY Henry L. Hanson
ATTORNEY

United States Patent Office 3,125,693
Patented Mar. 17, 1964

3,125,693

HIGH DYNAMIC INPUT IMPEDANCE AMPLIFIER

Joseph L. DeClue, Medfield, Mass., assignor to Minneapolis-Honeywell Regulator Company, Minneapolis, Minn., a corporation of Delaware
Filed Dec. 1, 1961, Ser. No. 156,202
9 Claims. (Cl. 307—88.5)

This invention relates generally to circuitry useful in controlling and amplifying signals from a high impedance electronic sensing element such as a photodiode, and more particularly to a new and improved amplifier circuit for use with such a high impedance element, which amplifier circuit is characterized by its high dynamic input impedance.

Those skilled in the art appreciate that high impedance sensing element circuits find many applications in modern-day data processing equipment as well as in numerous other types of signal responsive apparatus. For example, by means of a suitable photodiode circuit, light energy can be converted to electrical energy to activate end-of-tape circuitry in the tape drive of data processing equipment, or to activate character, index, center sample, or format control circuitry in a high speed printer of the type associated with data processing equipment. In addition to the illustrative uses for photodiode circuits mentioned hereinabove, a great variety of other uses for such circuits are known to workers in the electronic arts. Furthermore, other types of high impedance sensing elements may be used on the input in place of the photodiode described herein for the purpose of illustrating the invention.

In the utilization of such photodiodes and in the amplification of the output signals therefrom, it is advantageous to provide the amplifier circuit with a high dynamic input impedance and the present invention comprises a new and highly useful photodiode circuit which is notable for its high dynamic input impedance characteristics.

Accordingly, it is an object of this invention to provide a novel photodiode circuit of widespread utility.

It is another object of this invention to provide a new and improved photodiode circuit of highly desirable input impedance characteristics.

It is still another object of this invention to provide such a new and improved photodiode circuit characterized by its high dynamic input impedance.

It is a further object of this invention to provide such a desirable photodiode circuit which is relatively simple and inexpensive to manufacture and operate.

The above and other objects are realized in accordance with a specific illustrative embodiment of this invention wherein the photodiode amplifier circuit is comprised of a relatively small number of semiconductor elements arranged in two emitter follower stages, a common emitter stage, and a constant current stage. The two emitter follower stages each include a transistor connected with an emitter follower output and serve as preamplifiers for impedance matching purposes. The common emitter stage includes a transistor connected to the last preamplifier stage and serves as an output stage capable of driving one or a plurality of logical loads.

The constant current stage comprises a transistor connected in a series path with the first preamplifier stage, and this first constant current path, together with a second constant current path comprised of a resistor connected to the photodiode in circuit with the second preamplifier stage, provide two constant current loads connected to the output of the photodiode so as to present a high dynamic input impedance to the photodiode.

In the operation of the invention, as described in greater detail hereinbelow, the first constant current path maintains the quiescent emitter current of the first preamplifier stage at a desired minimum value. By so doing, the preamplifier stage may be biased at an operating point exhibiting high Beta characteristics. Furthermore, additional current flow through the first preamplifier stage, during the conduction of the photodiode, will be forced to flow into the output circuitry. The second constant current path maintains the current flow through a resistor connected to the junction of the photodiode and the first preamplifier stage to a relatively small but constant predetermined value, approximating the dark or leakage current of the photodiode.

Initially, the current to the base of the first emitter follower transistor is supplied by a diode, in series with the photodiode, together with the leakage current of the photodiode. As light energy is applied to the photodiode, it conducts and supplies current to the first preamplifier stage and the constant current resistor. Since the current through this resistor is maintained constant, the additional current supplied by the photodiode flows into the first preamplifier stage.

The photodiode sees a load consisting of the back resistance of the diode in series therewith and the input impedance of the transistor in the first emitter follower stage, both of which are very high. Since the current through the constant current resistor does not change with photodiode current changes, this resistor also presents a high input impedance to the photodiode. Accordingly, the invention comprises a high dynamic input impedance circuit for use with a photodiode sensing element.

The novel features which are characteristic of the invention are set forth with particularity in the appended claims. The invention itself, however, both as to its organization and method of operation, together with further objects and advantages thereof, will best be understood by reference to the following description taken in conjunction with the accompanying drawings in which:

Figure 1:
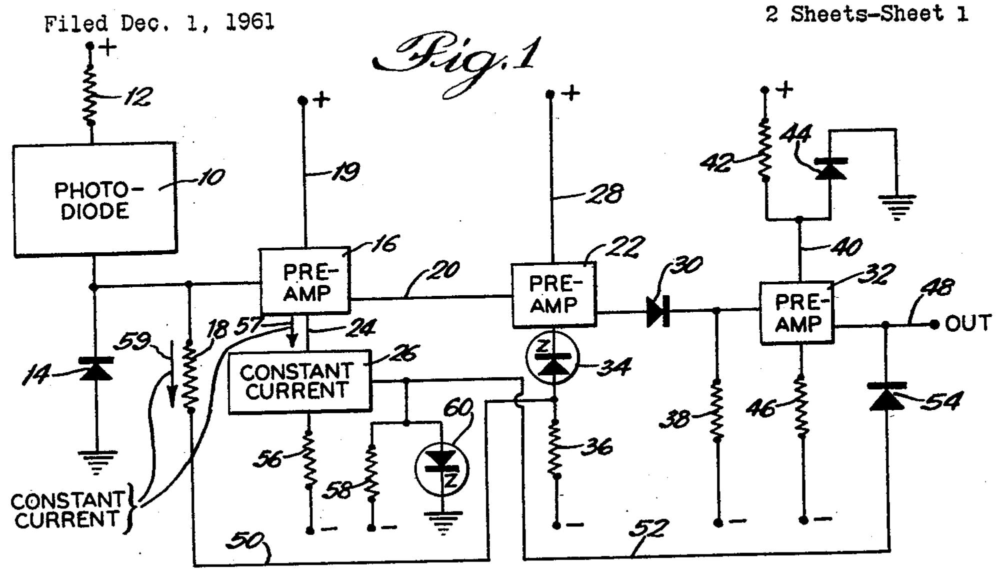
FIGURE 1 is a generally schematic diagram in block form, illustrating the construction and operation of the present invention.

Referring now to the drawing, and more particularly to FIGURE 1 thereof, there is shown in simplified block diagram form an illustrative embodiment of the invention. A light responsive sensing device, such as the photodiode 10, is connected in series circuit with a resistance 12 which is returned to a suitable source of positive voltage, and with a diode 14 which is returned to ground. The junction of photodiode 10 and diode 14 is connected to a first preamplifier stage 16 and also to a resistance 18 through which a constant current is flowing. The preamplifier stage 16 is connected by means of the lead 19 to a suitable positive voltage source and by means of the lead 20 to the input of a second preamplifier stage 22. The preamplifier stage 16 also is connected by means of the lead 24 to a constant current source 26.

The second preamplifier stage 22 is connected by the lead 28 to a suitable positive voltage source and at its output, by means of the diode 30, to the input of the output stage 32. In addition, the preamplifier stage 22 is connected to a suitable voltage regulating device, such as a Zener diode 34, in series with the resistance 36, which is returned to a suitable negative voltage source.

The output stage 32 is provided with an input resistance 38 which is returned to a suitable negative voltage source, and is connected by means of the lead 40 to the junction of a resistance 42 and a diode 44. Resistance 42 is returned to a suitable positive voltage source while the diode 44 is returned to ground. The output stage 32 also is connected through a resistance 46 to a suitable negative voltage source and to an output lead 48, which may be connected to drive one or more logical loads in response to the light energy which impinges upon the photodiode 10.

In accordance with a feature of this invention, the photodiode amplifier circuit is provided with two constant current paths which create a high dynamic input impedance for the photodiode 10. The first constant current path includes the resistance 18 which is connected in a feedback loop between the junction of photodiode 10 and diode 14 and the junction of the Zener diode 34 and resistance 36 in circuit with the second preamplifier stage 22. A second constant current path is provided by the constant current source 26 which has its input connected to the preamplifier stage 16. The constant current source 26 also is connected to the resistance 56, which is returned to suitable negative voltage source, and at the lead 52 to the junction of a resistance 58 and to a voltage regulating device, such as the Zener diode 60. The latter is also connected through the lead 52 and the diode 54 to the output line 48. The resistance 58 is returned to a suitable negative voltage source and the Zener diode 60 is returned to ground.

In the operation of the invention circuit, the "no light" condition of the photodiode 10 results in the conducting condition of the first preamplifier stage 16, the second preamplifier stage 22, the constant current source 26, and the output stage 32. At this time, due to the various bias potentials existing in the circuit, the diodes 30 and 54 are in an open or disconnect state. The constant current source 26 draws a fixed amount of current as indicated by the arrow 57. Accordingly, the preamplifier stage 16 is forced to draw the same fixed amount of current since this is supplied by the constant current source 26. The current flow through the resistor 18 is supplied by the leakage current of the photodiode 10 and will be seen to be limited by the cumulative voltage drop across the base-emitter circuits of the preamplifiers 16 and 22 and the voltage drop across the Zener diode 34.

If this constant current flow through resistance 18 is not supplied by the leakage or dark current of the photodiode 10, the diode 14 in series therewith supplies the necessary current flow.

The second preamplifier stage 22 supplies current to the Zener diode 34 and resistance 36. The resistance 38 supplies input current for the output stage 32, while the diode 44 together with the resistance 42 limits the maximum current flow in the output stage 32.

When the light energy is caused to impinge upon the photodiode 10, the diode 14 and the output stage 32 are placed in a "disconnect" or "off" condition. At this time, the constant current source 26 continues to draw exactly the same current with the result that the first preamplifier stage 16 has a current flow which is increased by the gain of this stage (B) times the net photodiode current. The same constant current flow continues to go through the resistance 18. Thus, the increase in current flow of the preamplifier stage 16 due to conduction in the photodiode can only be applied through the lead 20 to the second preamplifier stage 22 to increase the current flow therein. As its output potential increases due to this increase in current flow, the diode 30 conducts and the output stage 32 loses its input drive signal to cause it to be placed in the "off" or "disconnect" condition. This change in the conducting state of output stage 32 causes an output signal on the line 48 which then may be utilized as a drive signal for any logical loads connected thereto.

It will be appreciated by those skilled in the art that since the current flow through resistance 18 does not change with any input current change upon conduction of the photodiode 10, the resistance 18 represents a high impedance load to the photodiode 10. It further will be appreciated that since the photodiode 10 sees a load consisting of the back resistance of diode 14 and the input impedance of the preamplifier stage 16, both of which are very high, this load also represents a high impedance load to the photodiode 10. Accordingly, by the use of two constant current paths at the input of the photodiode to the amplifier circuit, a high dynamic input impedance circuit is obtained for use with the photodiode sensing element.

Figure 2:
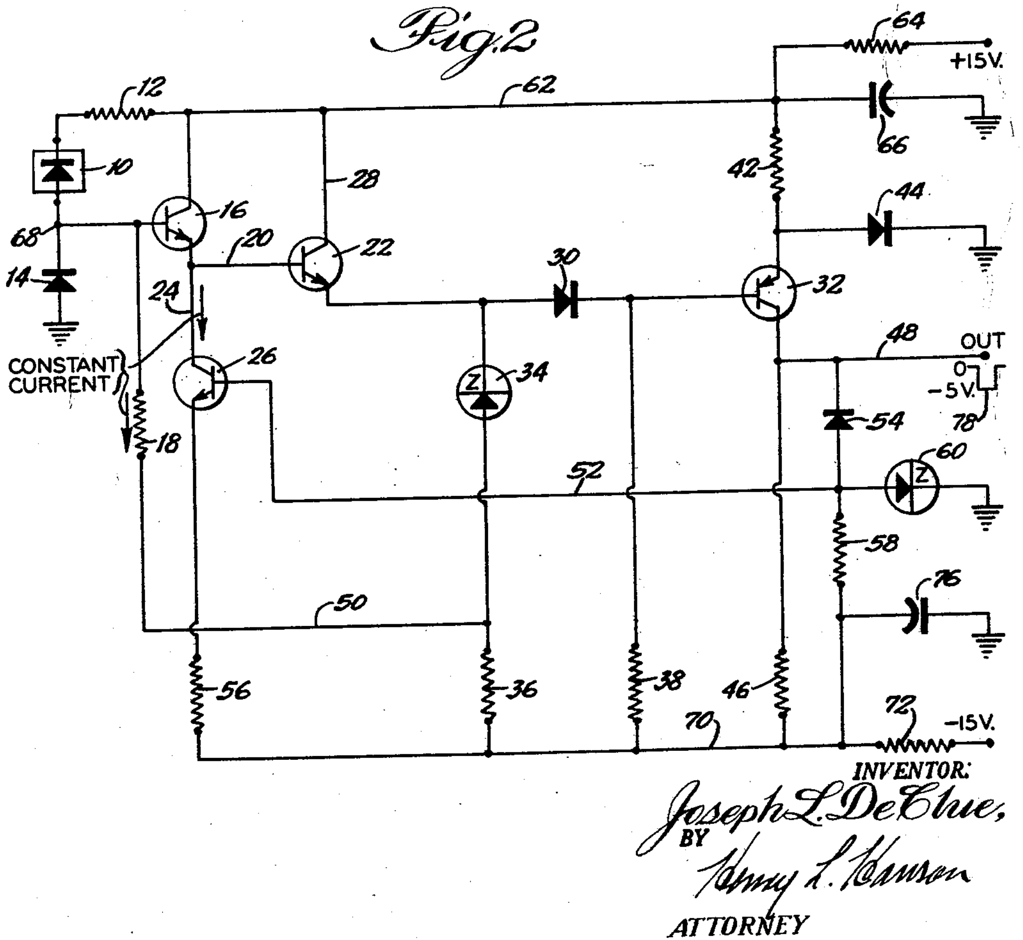
FIGURE 2 is a detailed schematic diagram of one specific embodiment of the present invention.

A detailed schematic circuit diagram of one particular embodiment of the present invention is shown in FIGURE 2 of the drawing. As there shown, each of the preamplifier stages, the output stage, and the constant current source may take the form of a suitable semi-conductor arrangement. Thus, the photoamplifier circuit may comprise two transistorized emitter follower stages, one transistorized common emitter stage and a transistorized constant current source. High input impedance being desirable, the two emitter follower stages serve as preamplifiers for impedance matching purposes. The output stage of this particular embodiment has been utilized for driving a plurality of logical loads at the end of an unterminated coaxial line.

As shown in FIGURE 2 of the drawing, the photodiode 10 has its cathode connected to a resistance 12, which in turn, is connected through a power lead 62 and a resistance 64 to a potential source of +15 volts. A capacitor 66 also is connected to the power lead 62 and is returned to ground. The anode of the photodiode 10 is connected to a junction point 68 to which the diode 14, the resistance 18, and the base of the preamplifier transistor 16 are connected. The collector of the preamplifier transistor 16 is connected to the power lead 62 while the emitter of preamplifier 16 is connected in emitter follower fashion to the input lead 20 of preamplifier transistor 22 and to the collector lead 24 of the constant current transistor 26.

The collector of transistor 22 is connected through lead 28 to power lead 62 and the emitter of transistor 22 is connected in emitter follower fashion to the diode 30 and to the voltage regulating Zener diode 34. Diode 30 is connected to the junction of the base resistance 38 and the base of the output transistor 32. The base resistance 38 and the collector resistor 46 of the output transistor 32 are each returned to the power lead 70 which is connected through the resistor 72 to the negative voltage supply −15 volts.

The emitter of output transistor 32 is connected through the resistor 42 to the positive voltage power lead 62 and to the diode 44, which, in turn, is returned to ground. The collector of output transistor 32 is connected to the output line 48 and through the diode 54 to the junction of the reference line 52, the Zener diode 60 and the resistance 58. Resistance 58 is connected to the negative voltage power lead 70 and to the capacitor 76, which, in turn, is returned to ground.

In addition, the resistance 18 is connected through the feedback line 50 to the junction of the Zener diode 34 and resistance 36, the latter being returned to the negative power lead 70. The emitter of the constant current transistor 26 also is connected through the resistance 56 to the negative power lead 70.

In the "no light" condition of the photodiode 10, all of the transistors—the preamplifier transistors 16 and 22, the constant current transistor 26, and the output transistor 32—are conducting while the diodes 30 and 54 are in a disconnect state. At this time, the base current for the first preamplifier transistor 16 is supplied by the diode 14 and by the dark or leakage current of the photodiode 10. The resistance 58 supplies current for the Zener diode 60 and the output line 48 is at a zero voltage condition.

The constant current source transistor 26 has approximately −5 volts on its base due to the Zener diode 60 and draws approximately one milliampere of current flow. Accordingly, the preamplifier transistor 16 is forced to also draw one milliampere current flow and its base current is supplied by the diode 14 together with the dark current of the photodiode 10. The resistance 18 always draws a fixed current flow, such as 8 microamperes, and if this is not supplied by the dark current through photodiode 10, it is supplied by the diode 14. The second preamplifier transistor 22 supplies current to the Zener diode 34 and the resistor 36 in series therewith.

In the operation of the invention, the transistors 16 and 22 draw approximately one milliampere of current to bias them into a higher B region. Accordingly, the constant current flow through resistor 18 is determined by the voltage thereacross in accordance with the base-to-emitter drops of transistors 16 and 22 and the Zener drop of diode 34, these elements forming a constant current regulating circuit. The base resistor 38 supplies the base current for the output transistor 32 and the resistor 42 limits the maximum collector current of output transistor 32. The diode 44 biases the emitter of output transistor 32, which, in turn, biases the collector slightly positive and renders long line driving more reliable.

When light energy is applied to the photodiode 10, the diode 14 is disconnected or placed in its non-conducting condition, and in addition, the output transistor 32 is disconnected or placed in a non-conducting condition. At this time, the constant current transistor 26 continues to draw exactly the same amount of current which, as stated above, may be approximately one milliampere. This is also true of the resistance 18 which continues to draw the same amount of current of 8 microamperes.

The current through the preamplifier transistor 16 is increased by B times the net photodiode current. Since the current through resistance 18 is maintained contant by the action of the constant current regulating circuit, any additional current flow resulting from the turning "on" of the photodiode 10 must flow through the preamplifier transistor 16. Its output current to the constant current transistor 26 cannot change by virtue of the second constant current path, and therefore, this increase in current flow—which is B times the net photodiode current—must go to the base of the second preamplifier transistor 22. Accordingly, the increase in emitter potential of transistor 22 causes diode 30 to conduct and thereupon deprives the output transistor 32 of all base drive. Transistor 32 is turned off and its output line 48 is clamped to a negative potential of −5 volts. The output signal on the output line 48 which results from the turning on of the photodiode 10 is illustrated by the pulse 78 in FIGURE 2.

When the photodiode is turned on, its anode sees the back impedance of diode 14 and the input impedance of transistor 16, which for all practical purposes is beta times the emitter load. This emitter load comprises the collector impedance of the constant current transistor 26 and the input impedance of the preamplifier transistor 22 which may be considered as beta times its emitter load. The emitter load of the preamplifier transistor 22 is resistance 36 in parallel with resistance 38.

In one particular embodiment of the invention which has been successfully constructed and operated, each of the resistances 36 and 38 had a value of 6800 ohms so that the emitter load of the preamplifier transistor 22 was 3400 times beta. This was an order of magnitude less than the collector impedance of transistor 26, which in the typical embodiment operated was approximately 2.5 megohms. Therefore, the base of preamplifier transistor 16 presented an impedance of about $beta^2$ times 3400 ohms to the photodiode 10. In the particular transistor employed for the preamplifier 16 in the actual typical embodiment operated, the transistor had a manufacturer's specification for beta minimum of 70, and even derating this by a factor of two, the base impedance of the preamplifier transistor 16 would be approximately 4 megohms. The diode 14 was rated at a one microampere leakage at 20 volts and therefore, it is clear that the dynamic input impedance for the photodiode was well over one megohm. With respect to the resistance 18, a value of one magohm was selected for the circuit embodiment operated and since the current through this resistance does not change even with changes in the input voltage, it appeared to the photodiode as a high impedance constant current load. Accordingly, during all phases of the operation of the invention circuit, the photodiode 10 sees only a high dynamic input impedance.

Figure 3:
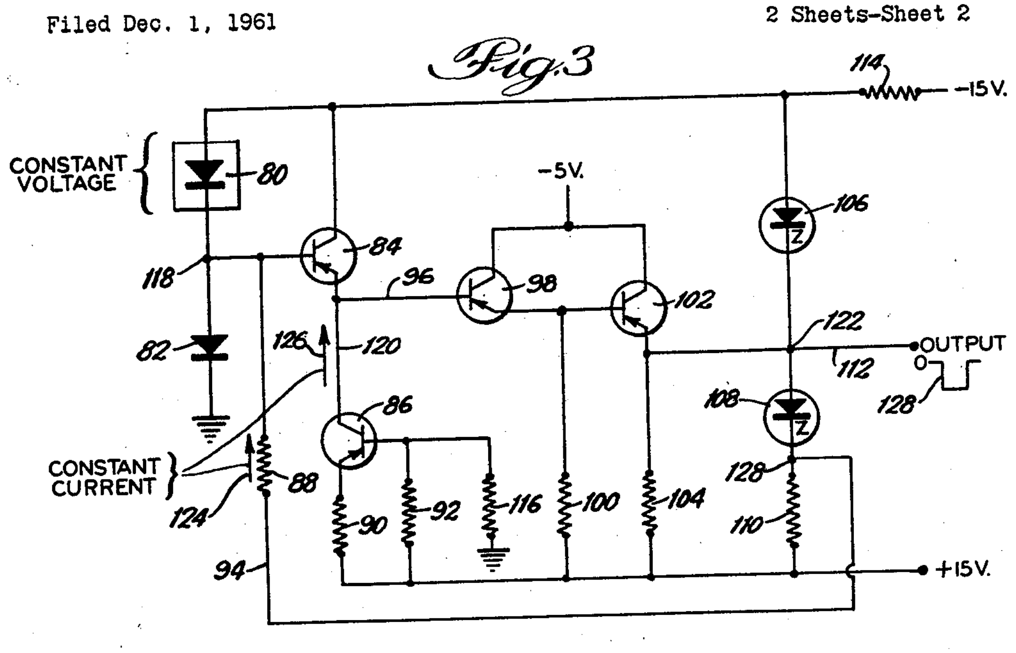
FIGURE 3 is a detailed schematic diagram of a modified embodiment of the present invention.

A further modification of the present invention is shown in FIGURE 3 of the drawings. In this embodiment, additional circuitry has been provided whereby variations in the input impedance of the amplifier, caused by changes in the collector to base voltage of the input transistor, may be avoided. It will be further noted that in this embodiment the voltage impressed across the photodiode element will be maintained constant and independent of current flow through this element. By so doing, the operating efficiency of the photodiode may be greatly improved.

As shown in FIGURE 3 of the drawings, the anode element of the photodiode 80 is connected to the collector of transistor 84, the anode of Zener diode 106 and to one end of the resistor 114, which in turn is connected to a negative potential source of 15 volts. The cathode of photodiode 80 is connected to a junction point 118 to which the diode 82, the resistor 88 and the base of preamplifier transistor 84 are connected. The emitter of transistor 84 is connected in emitter follower fashion to the input lead 96 of preamplifier transistor 98 and the collector lead 120 of the constant current transistor 86. The collector of transistor 98 and that of the following transistor 102 are connected to a negative potential source of 5 volts. The emitter and base elements of transistor 86 are each returned to a positive 15 volt source by means of resistors 90 and 92 respectively. The base element of transistor 86 is also returned to ground by means of resistor 116. The emitter of transistor 98 is connected to the base of transistor 102 and to resistor 100, the latter being returned to the positive 15 volt source. The emitter of transistor 102 is coupled to the positive voltage source by way of resistor 104 and is also connected to the junction point 122 which further connects the anode of Zener diode 108, the cathode of Zener diode 106 and the output line 112. The cathode of Zener diode 108 is returned to the resistor 88 by way of feedback line 94 and to the positive voltage source by means of resistor 110.

In the "no light" condition of the photodiode 80, all of the preamplifier stages 84, 98, and 102 will be in a conductive condition, thus establishing a quiescent voltage on the output line 112. In the embodiment illustrated, component values were chosen such that this level approximated ground potential. As previously described, a first constant current path, designated by the arrow 126, is connected to the emitter element of the first preamplifier stage. The voltage established at the base of transistor 86 by the voltage divider resistors 92 and 116 will control the current through this path and consequently the "no light" current through transistor 84. Since the base to emitter voltage drops across transistors 84, 98 and 102 are essentially constant, as well as the voltage drop across Zener diode 108, the current through the parallel connected resistor 88 will also be constant. This current path is designated by the arrow 124. An increase in current flow through the photodiode 80 which occurs during the "light" condition of the photodiode will be forced to flow into the following preamplifier stages. As previously noted, the two constant current paths will appear to the photodiode 80 as high impedance loads.

In order to maintain the voltage across the photodiode 80 and that across the collector to base junction of transistor 84 constant, a further Zener diode 106 is connected between the collector of transistor 84 and the emitter element of the last preamplifier stage 102. This Zener diode will be maintained in forward conduction by means of a current path including the negative 15 volt source, Zener diode 106, Zener diode 108, the resistor 110 and the positive potential source. Since the voltage drop across the base to emitter junctions of the preamplifier stages 84, 98 and 102 is constant, the voltage across the collector to base of transistor 84 and consequently across the photodiode will be that voltage developed across the Zener diode 106 minus the base to emitter voltage drops to the preamplifier transistors. During the operation of the photodiode amplifier circuit, the collector to base voltage of the input transistor and therefore the collector to base impedance of that transistor will remain constant, resulting in an improved circuit performance. A typical output waveform resulting from the application of a temporary light source signal to photodiode 80 is shown by the pulse 128 in FIGURE 3. The voltage regulating circuit shown in this embodiment of the invention may also be incorporated in principle in the preceding circuit of FIGURE 2.

While there has been shown and described specific embodiments of the present invention, it will, of course, be understood that various modifications and alternative constructions may be made without departing from the true spirit and scope of the invention. Therefore, it is intended by the appended claims to cover all such modifications and alternative constructions as fall within their true spirit and scope.

What is claimed as the invention is:

1. An amplifier circuit having a high dynamic input impedance for a photodiode sensing element comprising a photodiode having one electrode connected to a source of potential and its other electrode connected to a unilateral impedance element; a first preamplifier stage including a transistor having its base connected to the junction of said photodiode and said unilateral impedance element, a second preamplifier stage having its output connected to an output stage and its input connected to the emitter of said transistor; a first constant current path including a constant current stage connected to the emitter of said transistor adapted to maintain a constant current flow through said path such that any increase in current flow through said first preamplifier stage due to light energy upon said photodiode will be routed to said second preamplifier stage; and a second constant current path comprising a resistor having one terminal connected to the junction of said photodiode and said unilateral impedance element and its other terminal connected to a voltage regulating element at the output of said second preamplifier stage such that any change in current flow through said photodiode due to light energy upon said photodiode will be routed to said first preamplifier stage, said first and second constant current paths being adapted to present a high impedance load to said photodiode.

2. An amplifier circuit having a high dynamic input impedance for a photodiode sensing element comprising a photodiode having one electrode connected to a source of potential and its other electrode connected to a unilateral impedance element, a first preamplifier stage connected to the junction of said photodiode and said unilateral impedance element, a second preamplifier stage having its output connected to an output stage and its input connected to said first preamplifier stage; a first constant current path including a constant current stage also connected to said first preamplifier stage adapted to maintain a constant current flow through said path such that any increase in current flow through said first preamplifier stage due to light energy upon said photodiode will be routed to said second preamplifier stage; and a second constant current path comprising a resistance having one terminal connected to the junction of said photodiode and said unilateral impedance element and its other terminal connected to a voltage regulating element at the output of said second preamplifier stage such that changes in current flow through said photodiode due to light energy upon said photodiode will be routed to said first preamplifier stage, said first and second constant current paths being adapted to present a high impedance load to said photodiode.

3. An amplifier circuit having a high input impedance for a photodiode sensing element comprising a photodiode having a first electrode connected to a voltage source and a second electrode connected to a unilateral impedance element, a first preamplifier stage including a transistor having its base connected to the junction of said photodiode and said unilateral impedance element and its collector connected to said voltage source, a second preamplifier stage having its output connected to a third preamplifier stage and its input connected to the emitter of said transistor; a first constant current path including a constant current stage connected to the emitter of said transistor adapted to maintain a constant current flow through said path such that an increase in current flow through said first preamplifier stage due to light energy upon said photodiode will be forced to flow into said second preamplifier stage; a second constant current path comprising a resistor having one terminal connected to the junction of said photodiode and said unilateral impedance element and its other terminal connected to a first voltage regulating device at the output load of said third preamplifier stage; and a second voltage regulating device connected between said output load and the first electrode of said photodiode adapted to maintain a constant voltage across said photodiode and the collector-to-base junction of said transistor.

4. An amplifier circuit having a high input impedance for a photodiode sensing element comprising a photodiode connected between a source of biasing potential and a unilateral impedance element, said unilateral impedance element being further coupled to a reference point, a first preamplifier stage having its input connected to the junction of said photodiode and said unilateral impedance element, means coupling the output of said first preamplifier stage to the output of said amplifier circuit, a first constant current path including a constant current source coupled between the output of said first preamplifier stage and said reference point such that any change in current flow through said first preamplifier stage due to light energy upon said photodiode causes a current change at the output of said amplifier circuit, and a second constant current path comprising a resistor having one terminal connected to said junction and its other terminal coupled to the output of said amplifier circuit by way of a voltage regulating element.

5. An amplifier circuit as defined in claim 4 wherein said first preamplifier stage comprises a transistor having base, emitter and collector elements with said photodiode being connected between the base and collector elements of said transistor and further comprising a second voltage regulating element connected between the output of said amplifier circuit and the collector of said transistor to maintain a constant voltage drop across said photodiode.

6. An amplifier circuit having a high dynamic input impedance for a photodiode sensing element comprising a photodiode connected to a unilateral impedance element, a preamplifier stage having its input connected to the junction of said photodiode and said unilateral impedance element, a first constant current load connected to the output of said preamplifier stage such that any change in current flow through said preamplifier stage due to light energy upon said photodiode causes a change in the output current, and a second constant current load having one end thereof connected to said junction and the other end thereof coupled to the output of said preamplifier stage.

7. An amplifier circuit having a high dynamic input impedance for a photodiode sensing element in accordance with claim 6 wherein said first constant current load comprises a constant current transistor stage.

8. An amplifier circuit having a high dynamic input impedance for a photodiode sensing element in accordance with claim 6 wherein said second constant current load comprises a relatively high resistance.

9. In an amplifier circuit having a high dynamic input impedance, a pair of input terminals adapted to have a high impedance sensing element connected therebetween, means for coupling a biasing potential to a first one of said input terminals, a unilateral impedance element coupled between the second one of said input terminals and a reference point, a preamplifier stage having its input connected to said second input terminal, a first constant current path coupled between the output of said preamplifier stage and said reference point such that any difference in current flow through said preamplifier stage due to a condition sensed at said input terminals causes substantially the entire difference current through said preamplifier stage to flow into an output circuit, and a second constant current path having one end thereof connected to said second input terminal and its other end coupled to the output of said preamplifier stage by way of a voltage regulating element.

References Cited in the file of this patent

UNITED STATES PATENTS 3,069,552 Thomson -------------- Dec. 18, 1962